(12) United States Patent  (10) Patent No.: US 7,782,388 B2
Nishikawa et al.  (45) Date of Patent: Aug. 24, 2010

(54) SOLID IMAGE PICKUP UNIT AND CAMERA MODULE

(75) Inventors: Takuo Nishikawa, Fussa (JP); Kazuo Tansho, Mizuho-machi (JP)

(73) Assignee: Konica Minolta Opto, Inc., Tokyo (JP)

( * ) Notice: Subject to any disclaimer, the term of this patent is extended or adjusted under 35 U.S.C. 154(b) by 1023 days.

(21) Appl. No.: 11/505,806

(22) Filed: Aug. 18, 2006

(65) Prior Publication Data

US 2007/0047098 A1 Mar. 1, 2007

(30) Foreign Application Priority Data

Aug. 24, 2005 (JP) ............................. 2005-242446

(51) Int. Cl.
*H04N 5/225* (2006.01)

(52) U.S. Cl. ...................................... 348/340

(58) Field of Classification Search ................. 348/340, 348/65; 359/819; 250/208.1
See application file for complete search history.

(56) References Cited

U.S. PATENT DOCUMENTS 7,221,524 B2 * 5/2007 Ye et al. ...................... 359/819
2005/0237418 A1 * 10/2005 Sakamoto ................... 348/340

FOREIGN PATENT DOCUMENTS

JP 2005-129721 * 5/2005

* cited by examiner

*Primary Examiner*—Tuan Ho
(74) *Attorney, Agent, or Firm*—Finnegan, Henderson, Farabow, Garrett & Dunner, L.L.P.

(57) ABSTRACT

A solid image pickup device includes an image pickup unit on which image pickup elements are arranged in a two dimensional form, a print on which the image pickup unit is mounted, and protrusions formed in a pattern form of a conductive material on a floor area, of the print board, covered by the image pickup unit such that the protrusions surround a central part of the floor area, wherein the image pickup unit is fixed with an adhesive on the protrusions and the floor area of the print board.

10 Claims, 5 Drawing Sheets

F-F CROSS-SECTION

*PRIOR ART*

SOLID IMAGE PICKUP UNIT AND CAMERA MODULE

This application is based on Japanese Patent Application No. 2005-242446 filed on Aug. 24, 2005 in Japan Patent Office, the entire content of which is hereby incorporated by reference.

FIELD OF THE INVENTION

The present invention relates to a sold image pickup device for which an image unit chip is fixed on a print board.

BACKGROUND OF THE INVENTION

In recent years, solid image pickup devices that photoelectrically convert subject images formed by an image pickup optical system have come to be widely used for video cameras and still cameras. Further, as a small-sized camera module, such solid image pickup devices are mounted on portable terminals which are small and thin type electronic devices, such as portable telephones and PDAs (Personal Digital Assistant).

As an image pickup unit in such solid image pickup devices, a CCD (Charge Coupled Device) type image sensor, a CMOS (Complementary Metal Oxide Semiconductor) type image sensor, or the like is used. In these solid image pickup apparatuses, an image pickup unit is adhesively fixed to a board in a state of a bare chip, and the image pickup device and the board are electrically connected by bonding wires.

A solid image pickup unit in which an image pickup unit is adhesively fixed to a board, as described above, is disclosed in which plural protrusions are formed on a board, and the image pickup unit is adhered with a support by the protrusions so as to reduce deformation of the image pickup unit caused by adhesion with a board having insufficient flatness (for example, refer to Patent Document 1, that is, Japanese Laid Open Patent Document TOKKAI No. 2005-129721).

Cameras and camera modules employing the above described solid image pickup device have a purpose to obtain a higher image quality. Therefore, an image pickup unit with a large number of pixels which are disposed in a high density with a small pixel pitch has come to be adopted for these cameras and camera modules.

With this high pixelization of this kind of image pickup unit, it is necessary that the light receiving surface of an image pickup unit disposed at an image forming plane of an image pickup optical system is flat and disposed accurately orthogonal to the optical axis of the image pickup optical system. For example, in the case where the pixel pitch of the image pickup unit $\delta=2.2$ μm and F number of the image pickup optical system F=2.8, with an assumption that the focal depth is $2F\delta$, the focal depth is 12.32 μm. Accordingly, the light receiving surface is needed to be disposed such that the deviation amount of the most peripheral diagonal part of the image pickup unit surface is within 12.32 μm with respect to the plane orthogonal to the optical axis at the point where the image pickup unit surface and the optical axis intersect with each other. That is, the focal depth on the image plane side is extremely small, and setting of the image pickup unit surface with respect to the optical axis of the image pickup optical system requires an extremely high accuracy.

Although the solid image pickup device disclosed in the above Patent Document 1 can reduce the distortion of the image pickup unit surface, the board to which the image pickup unit is adhered is formed by a mold, and accordingly, it is difficult to accurately conform the respective heights of the protrusions formed on the board. Therefore, it is difficult to produce a solid image pickup device in which the image pickup unit surface is stably in a desired direction with respect to the surface of the substrate. Further, mold processing and management of exact forming conditions are required, and particularly, the cost of mold processing is increased.

Further, in the case of COB (Chip In Board) mounting of an image pickup unit in a bare chip state on a print board in order to make the solid image pickup device further thin, the structure disclosed in the Patent Document 1 cannot be applied.

To solve problems as described above, an object of the invention is to provide a thin-type solid image pickup device which can be manufactured such that, in the case of COB (Chip In Board) mounting of an image pickup unit in a bare chip state on a print board, it is possible to accurately conform the respective heights of the protrusions formed on the substrate at a low cost, and it is also possible to make the image pickup unit surface stably in a desired direction with respect to the surface of the board.

SUMMARY OF THE INVENTION

The invention includes the following structures.

(Structure 1)

A solid image pickup device, including:

an image pickup unit on which image pickup elements are arranged in a two dimensional form;

a print board on which the image pickup unit is mounted; and protrusions formed in a pattern form of a conductive material on a floor area, of the print board, covered by the image pickup unit such that the protrusions surround a central part of the floor area;

wherein the image pickup unit is fixed with an adhesive on the protrusions and the floor area of the print board.

(Structure 2)

A solid image pickup device, comprising:

an image pickup unit on which image pickup elements are arranged in a two dimensional form;

a print board on which the image pickup unit is mounted; and plural band-shaped protrusions formed in a pattern form of a conductive material on a floor area, of the print board, covered by the image pickup unit such that the plural band-shaped protrusions concentrically surround a substantial center of the floor area; and a resist layer coated on the plural band-shaped protrusions on the floor area of the print board, wherein the image pickup unit is adhesively fixed on the resist layer.

DETAILED DESCRIPTION OF THE PREFERRED EMBODIMENT

Figure 1:
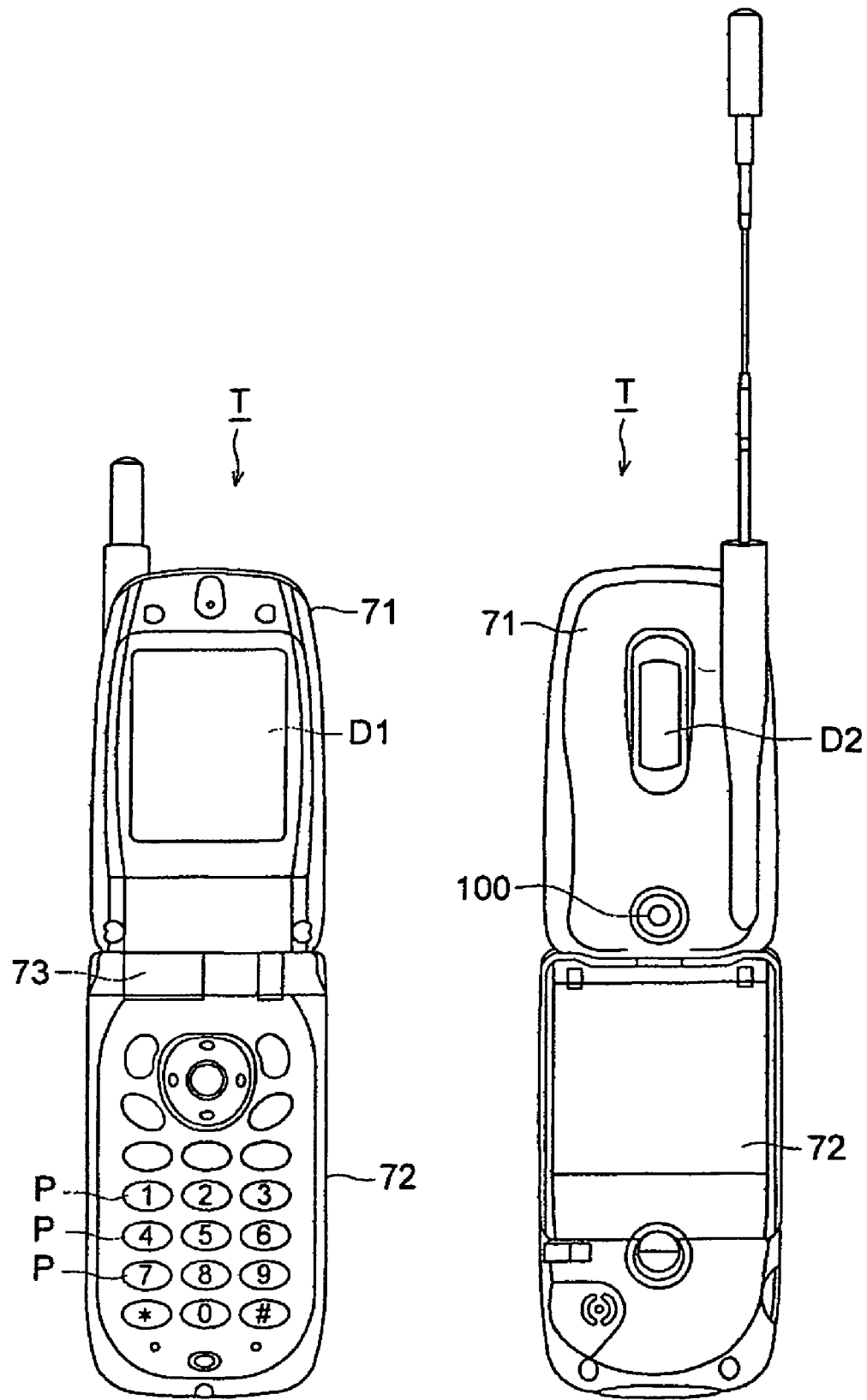
FIG. 1 is an external view of a portable telephone as an example of a portable terminal provided with a camera module in an embodiment in accordance with the invention.

An embodiment in accordance with the invention will be described in detail, referring to the drawings, however, the invention is not limited thereto.

FIG. 1 is an external view of a portable telephone T as an example of a portable terminal provided with a camera module 100 in accordance with the present embodiment.

The portable telephone T shown in the figure is constructed by connecting an upper housing 71, as a casing provided with a display screens D1 and D2, and a lower housing 72 provided with an operation button P through a hinge 73. The camera module 100 is built-in below the display screen D2 in the upper housing 71, and is disposed such that the camera module 100 can take in light from the outer surface side of the upper housing 71.

Herein, the camera module 100 may be disposed above the display screen D2 in the upper housing 71 or at a side of the display screen D2. Further, the portable telephone is of course not limited to a folding type.

Figure 2:
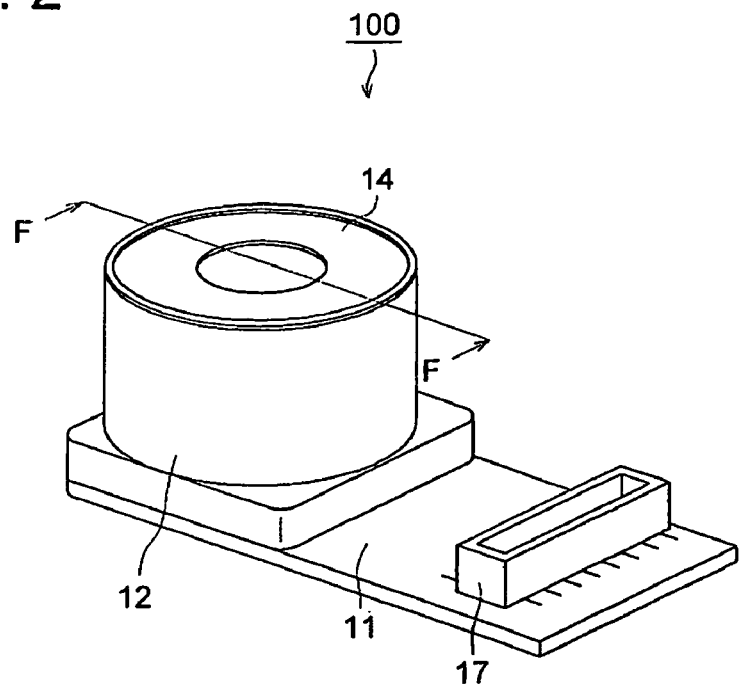
FIG. 2 is a perspective view of a camera module in accordance with the embodiment.

FIG. 2 is a perspective view of the camera module 100 in accordance with the present embodiment.

The camera module 100 shown in the figure includes a print board 11 with an image pickup unit mounted thereon, a connecter 17 for connection with another control board in the portable terminal, a lens frame 14 having an image pickup optical system, and a holding member 12 to hold the lens frame 14. Further, various resistances and capacitors and the like, not shown, are mounted on the print board 11.

The camera module 100 may be constructed in such a manner that a flexible print board is connected to a print board 11 having an image pickup unit mounted thereon, and is provided with a connection section at an end so as to be connected to another control board of the portable terminal.

Figure 3:
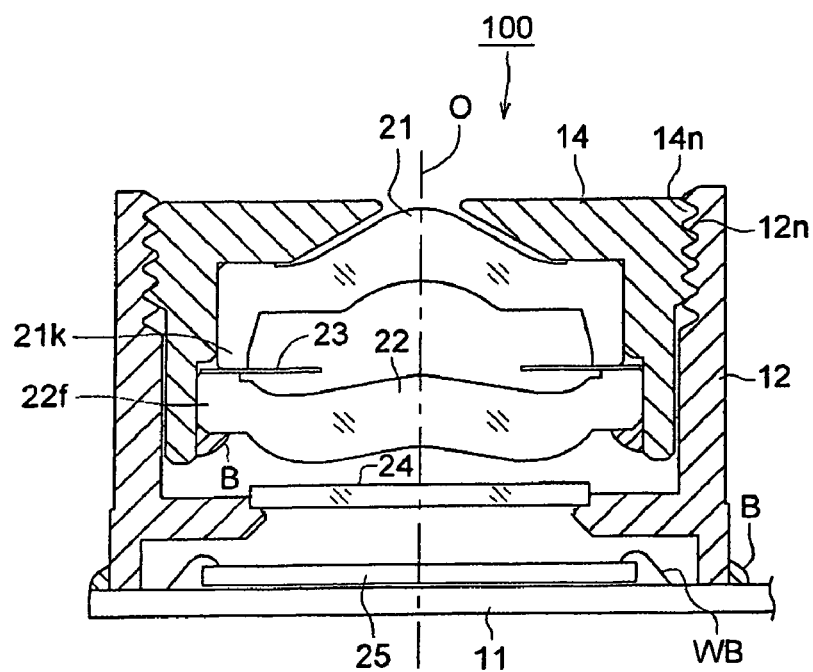
FIG. 3 is a cross-sectional view of the camera module shown in FIG. 2.

FIG. 3 is a cross-sectional view of the camera module 100 shown in FIG. 2, with respect to F-F line. In the figures described below, the same reference symbols will be given to the same members in the description to avoid duplication of description.

As shown in FIG. 3, an image pickup optical system including a first lens 21, second lens 22, and fixed aperture are built-in in the lens frame 14 of the camera module 100. In this image pickup optical system, a leg 21k of the first lens 21 and a flange 22f of the second lens 22 are struck against each other in the lens frame 14 so that the distance between the first lens 22 and the second lens 22 is determined, while the outer circumference is engaged with the lens frame to align the axes, and the second lens 22 is fixed to the frame 14 by an adhesive B. An infrared cut filter 24 may be omitted in the case of subjecting the first lens 21 or second lens 22 to infrared cut coating.

An image pickup unit 25 being a bare chip disposed on the image plane side of the image pickup optical system is fixed to the print board 11 with adhesive and electrically connected with it by plural bonding wires WB.

The holding member 12 holding the lens frame 14 is formed with a female screw 12n, and the lens frame 14 is formed with a male screw 14n to screw together with the female screw 12n. Thus, by rotating the lens frame 14, the lenses can be moved in the optical axis direction 'O', which allows focus adjustment for a predetermined distance of a subject. Further, the holding member 12 is fixed to the print board 11 with adhesive B.

Figure 4A:
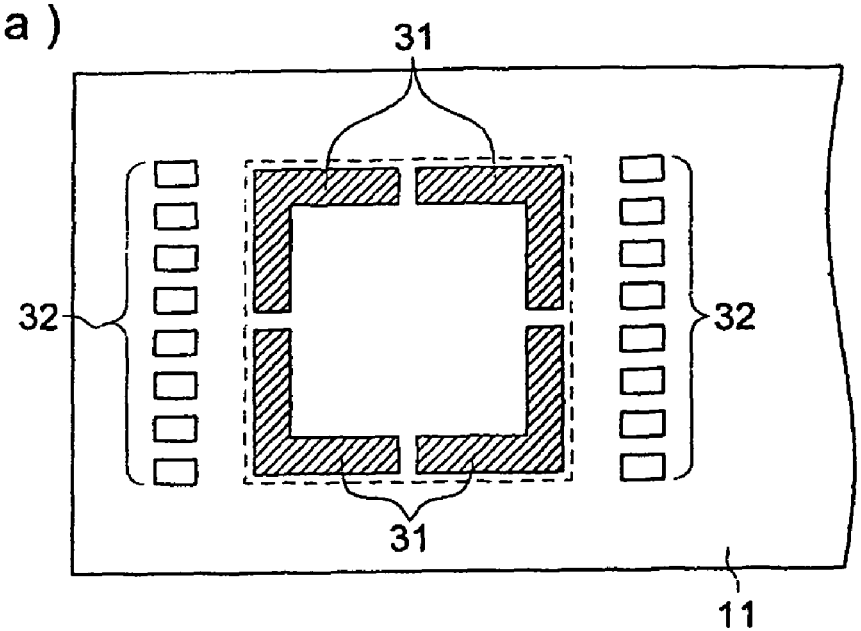
FIG. 4 is a schematic diagram showing an example of protrusions in a pattern form of a conductive material formed in an area, of a print board in accordance with the embodiment, covered by an image pickup unit.
Figure 4B:
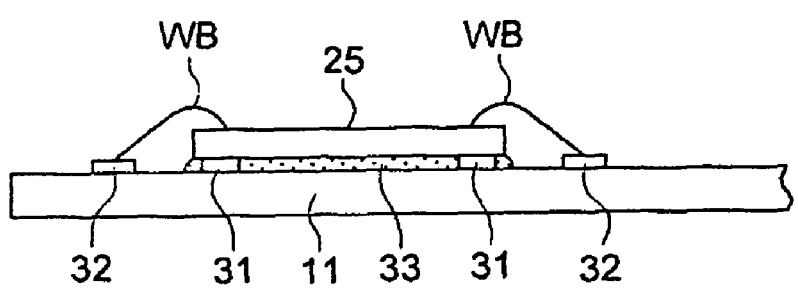

FIGS. 4A and 4B are schematic diagrams showing an example of protrusions in a pattern form of the conductive material formed in the area, of the print board 11 in accordance with the present embodiment, covered by the image pickup unit 25. FIG. 4A is a top view of the print board 11 and FIG. 4B shows a cross-section in a state where the image pickup unit 25 is mounted on the print board 11.

The main body of the print board 11, shown, is a PWB (Print wiring Board) formed of a material, such as glass epoxy, paper phenol, ceramic, or the like. The image pickup unit 25 is COB-mounted in a bare chip state.

The print board 11 shown in FIG. 4A is formed with protrusions 32 in a pattern form of a conductive material. In the same process, the print board 11 is also formed with protrusions 31 in a pattern form of a conductive material in the area to be covered by the image pickup unit shown by dashed lines, surrounding the central part of the area. On the other hand, in the central part of the area, corresponding to the central part of the image pickup unit, protrusions are not formed intentionally. Herein, protrusions formed as described above may also be used for wiring.

Other patterns formed on the print board 11, such as wiring patterns formed to be connected with the respective protrusions 31 and 32, are omitted in the figures and description.

Further, as shown in FIG. 4B, the image pickup unit 25 is mounted on the protrusions 31 on the print board 11 and adhesively-fixed by adhesive 33, and then a pad electrode, not shown, formed on the image pickup unit 25 and the protrusions 32 are electrically connected by bonding wires WB. Thus, a COB-mounted solid image pickup device is obtained.

In such a manner in mounting the bare-chip image pickup unit 25 on the print board 11, by simultaneously forming the protrusions 31 by the use of a forming process for formation of wiring patterns on the print board 11 with the conductive material, the thickness of the protrusions 31 on which the image pickup unit 25 is mounted is made accurately uniform. This makes it possible to maintain the image pickup surface of the image pickup unit 25 stably parallel to the print board 11 through mass-production, and to obtain a thin-type solid image pickup device at substantially no cost of forming the protrusions 31.

Further, by forming protrusions in an area to be covered by the image pickup unit such that the protrusions surround the area corresponding to the central part of the image pickup unit, without forming protrusions inside this area, the adhesive layer in the area corresponding to the central part of the image pickup unit becomes thick. This brings the following effects in a case of using a heat-curable adhesive to fix the image pickup unit to the board.

Figure 8:
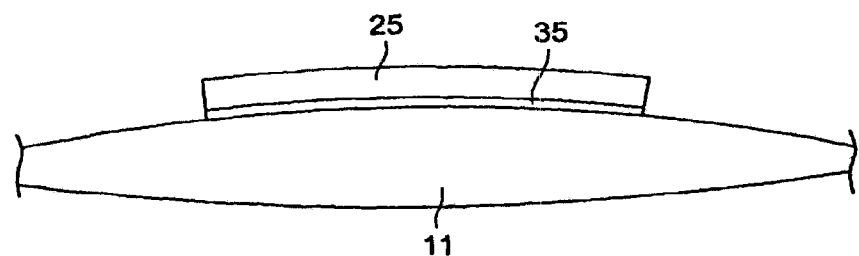
FIG. 8 is a schematic diagram showing a state where an image pickup unit 25 is curved in a conventional solid image pickup device.

In FIG. 8, in a case where a conventional diepad 35 is formed in substantially the same shape as the image pickup unit 25 at the part, of the print board, covered by the image pickup unit, and the image pickup unit and print board are bonded with a heat-curable adhesive through the diepad, since the thermal expansion coefficient is different between the image pickup unit 25 and the print board 11, a stress is generated by the difference in the respective shrinking amounts when the temperature falls to an ambient temperature, which causes a problem that the central part of the image pickup unit 25 is expanded and fixed in a curved shape. In other words, that the image pickup unit 25 having a smaller amount of shrinkage is pressed at the central part thereof by the print board 11 having a larger amount of shrinkage.

However, in the case of a print board in the present embodiment, an adhesive layer is applied thick in the area corresponding to the central part of the image pickup unit, while an adhesive layer is applied thin in the area corresponding to the area surrounding the central part covered by the image pickup unit, due to the presence of the protrusions. Accordingly, the stress caused by the difference between the respective shrinking amounts is offset by the difference from the shrinking amount of the adhesive at the time of curing, which solves the problem of curving of the image pickup device.

Figure 5:
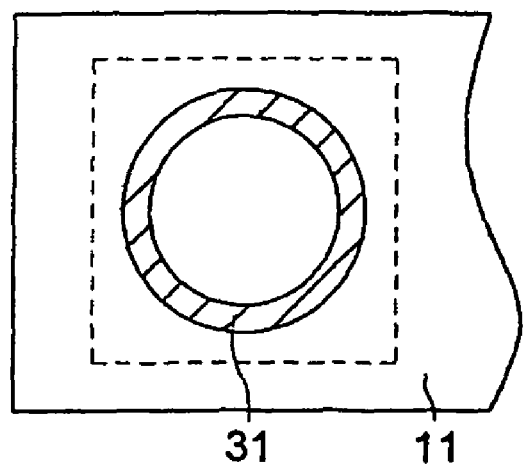
FIGS. 5A to 5C are diagrams showing modification examples of protrusions in a pattern form of a conductive material formed in an area, of a print board, covered by an image pickup unit.
Figure 5:
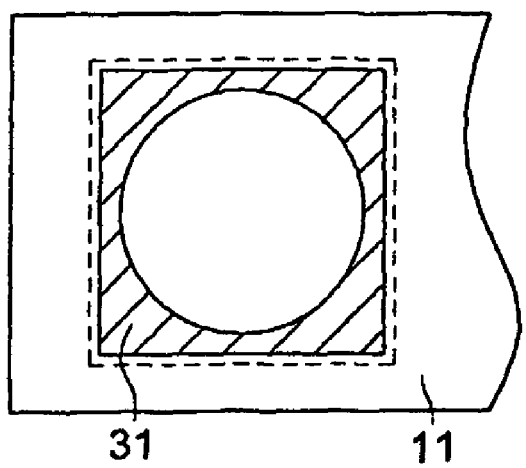
Figure 5:
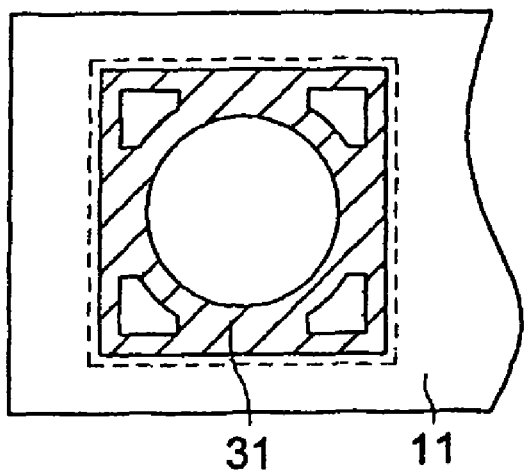

FIGS. 5A to 5C are diagrams showing other modification examples of protrusions in a pattern form of the conductive material formed on the print board 11 in the area covered by the image pickup unit. Each of these figures is a front view of a print board, wherein dashed lines show an area covered by the image pickup unit 25 mounted on the board, and the protrusion in a pattern form of the conductive material formed inside the area is extracted to be shown.

FIG. 5A shows a protrusion 31 of the conductive material formed in a ring shape. FIG. 5B shows a protrusion formed in the area enclosed by a rectangle and circle. FIG. 5C shows an example modified from FIG. 5B.

Herein, the protrusion 31 in a pattern form formed in an area covered by the image pickup unit is not limited to these shapes, and any pattern can be employed as long as the protrusion in a pattern form of a conductive material is formed in advance in an area covered by the image pickup unit such that the conductive material surrounds the area corresponding to the central part of the image pickup unit, and no protrusion is formed in the central part. Further, resist may be coated on the protrusion 31.

Figure 6:
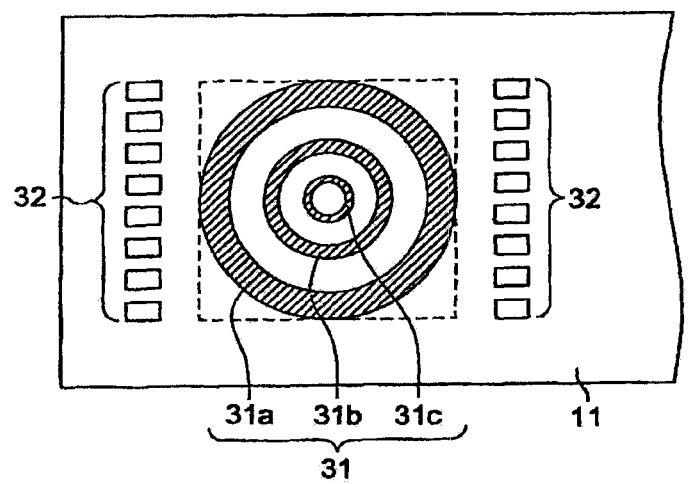
FIG. 6 is a schematic diagram showing another example of protrusions in a pattern form of a conductive material formed in an area, of a print board in accordance with the embodiment, covered by an image pickup unit.

FIG. 6 is a schematic diagram showing another example of protrusions in a pattern form of a conductive material formed in an area covered by an image pickup unit 25 of a print board 11 in accordance with the present embodiment. The figure is a plane view of the print board 11 viewed from above.

The print board 11 shown in the figure is formed, in advance in the same process, with protrusions 32, and protrusions 31 in the area covered by the image pickup unit and shown by the dashed lines in such a manner that the protrusions 31 surround the part corresponding to the center of the image pickup unit. Further, the shape of each protrusion 31 is formed in such a manner that the width of the individual protrusions 31a to 31c in the area covered by the image pickup unit and shown by the dashed lines is larger as the protrusion is further from the part corresponding to the center of the image pickup unit. In other words, in the figure, the protrusion 31a is formed with the largest width, and the protrusion 31c with the smallest width. Herein, other patterns formed on the print board 11, such as the wiring patterns formed in connection with the protrusions 32 and 31, are omitted in the figure.

Figure 7:
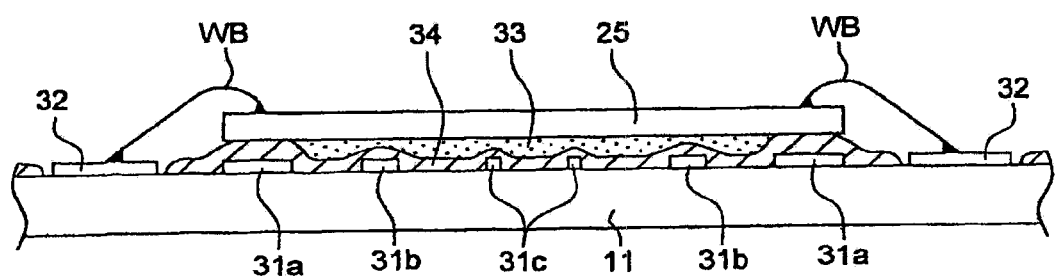
FIG. 7 is a schematic diagram showing a cross-section in a state where an image pickup unit is mounted on the print board shown in FIG. 6.

FIG. 7 is a schematic diagram showing the cross-section of a structure in a state where the image pickup unit 25 is mounted on the print board 11 shown in FIG. 6.

As shown in the figure, a resist 34 is coated on the print board 11, the image pickup unit 25 is mounted on the layer of the resist 34 and fixed with an adhesive 33, and then a pad electrode, not shown, formed on the image pickup unit 25 and the protrusions 32 are electrically connected by bonding wires WB, thus producing a COB-mounted solid image pickup device.

With regard to the thickness of the layer of the coated resist 34, the wider the protrusion, the thicker the resist remains on the protrusion. As shown, the cross-sectional shape of the resist layer is the thickest at a protrusion 31a corresponding to the area of the outermost part of the image pickup unit 25. Accordingly, the adhesive 33 between the image pickup unit 25 and the resist 34 is coated thick in the area corresponding to the central part of the image pickup unit 25 and coated thin in the area corresponding to the outermost part.

Also by forming the protrusion 31 and the layer of the resist 34 in such a manner, the thickness on which to mount the image pickup unit 25, that is, the total thickness of the protrusion 31, resist 34, and the adhesive layer 33 is made exactly flat. Thus, the image pickup surface of the image pickup unit 25 can be maintained stably parallel to the print board 11 through mass production, with the same effects as described above.

Further, with regard to the width of the individual protrusions of the conductive material in the area covered by the image pickup unit, the protrusions are formed in such a way that the nearer the protrusion to the outline of the image pickup unit, namely, the further from the position corresponding to the center of the image pickup unit, the wider the pattern. In such a way, when a resist layer is coated, the resist layer is formed thick at a part where the width of the protrusion is large and thin at a part where the width of the protrusion is thin, as shown. Thus, the adhesive layer is made thin at a part surrounding the central part of the area and thick at the central part, and even when a curable and shrinkable adhesive is used, a stress caused by the difference between the board and the image pickup unit in the shrinking amount is offset by the difference between the board and the adhesive in the shrinking amount at the time of curing, solving the problem of curving of the image pickup unit.

That is, in accordance with the invention, in COB-mounting of a bare chip image unit on a print board, it is possible to accurately conform the respective heights of protrusions formed on the board at a low cost, and accordingly, it is possible to obtain a thin-type solid image pickup device in which the image pickup unit surface is stably maintained parallel to the board.

What is claimed is:

1. A solid image pickup device, comprising:
   an image pickup unit on which image pickup elements are arranged in a two dimensional form;
   a print board on which the image pickup unit is mounted; and
   protrusions formed in a pattern form of a conductive material on a floor area, of the print board, covered by the image pickup unit such that the protrusions surround a central part of the floor area;
   wherein the image pickup unit is fixed with an adhesive on the protrusions and the floor area of the print board.

2. The solid image pickup device of claim 1, wherein the protrusions are unitedly formed as a single continuous shape.

3. The solid image pickup device of claim 1, wherein the image pickup unit is bonded with a heat-curable adhesive on the protrusions and the floor area of the print board.

4. A solid image pickup device, comprising:
   an image pickup unit on which image pickup elements are arranged in a two dimensional form;
   a print board on which the image pickup unit is mounted; and plural band-shaped protrusions formed in a pattern form of a conductive material on a floor area, of the print board, covered by the image pickup unit such that the plural band-shaped protrusions concentrically surround a substantial center of the floor area; and a resist layer coated on the plural band-shaped protrusions on the floor area of the print board, wherein the image pickup unit is adhesively fixed on the resist layer.

5. The solid image pickup device of claim 4, wherein a width of each of the plural band-shaped protrusions is larger as the protrusion is further from the substantial center, the width being along a direction outward from the substantial center.

6. The solid image pickup device of claim 4, wherein the plural band-shaped protrusions are substantially circular.

7. The solid image pickup unit of claim 4, wherein the plural band-shaped protrusions are substantially rectangular.

8. The solid image pickup device of claim 4, wherein the resist layer and image pickup unit are bonded with a heat-curable adhesive.

9. A camera module, comprising:

the solid image pickup device of claim 1; and an image pickup optical system that provides a subject image to the solid image pickup device.

10. A camera module, comprising:

the solid image pickup device of claim 4; and an image pickup optical system that provides a subject image to the solid image pickup device.

* * * * *